(12) United States Patent
Leirer et al.

(10) Patent No.: US 9,972,748 B2
(45) Date of Patent: May 15, 2018

(54) THIN-FILM SEMICONDUCTOR BODY WITH ELECTRONMAGNETIC RADIATION OUTCOUPLING STRUCTURES

(71) Applicant: OSRAM Opto Semiconductors GmbH, Regensburg (DE)

(72) Inventors: Christian Leirer, Friedberg (DE); Anton Vogl, Sinzing (DE); Andreas Biebersdorf, Regensburg (DE); Rainer Butendeich, Regensburg (DE); Christian Rumbolz, Lappersdorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days. days.

(21) Appl. No.: 14/927,325

(22) Filed: Oct. 29, 2015

(65) Prior Publication Data

US 2016/0049550 A1 Feb. 18, 2016

Related U.S. Application Data

(62) Division of application No. 14/002,487, filed as application No. PCT/EP2012/053348 on Feb. 28, 2012, now Pat. No. 9,202,967.

(30) Foreign Application Priority Data

Mar. 3, 2011 (DE) .......... 10 2011 012 928

(51) Int. Cl.
*H01L 33/20* (2010.01)
*H01L 21/02* (2006.01)
(Continued)

(52) U.S. Cl.
CPC .......... *H01L 33/20* (2013.01); *H01L 21/0237* (2013.01); *H01L 21/0254* (2013.01);
(Continued)

(58) Field of Classification Search
CPC ..... H01L 33/20; H01L 33/22; H01L 33/0075; H01L 33/007; H01L 21/0237;
(Continued)

(56) References Cited

U.S. PATENT DOCUMENTS 5,528,615 A 6/1996 Shima
6,657,236 B1 12/2003 Thibeault et al.
(Continued)

FOREIGN PATENT DOCUMENTS

CN 1423842 A 6/2003
CN 101490859 A 7/2009
(Continued)

OTHER PUBLICATIONS

Buttari, D., et al., "Selective Dry Etching of GaN over AlGaN in BCL3/SF6 Mixtures," International Journal of High Speed Electronics and Systems, vol. 14, No. 3, 2004, pp. 756-761.
(Continued)

*Primary Examiner* — Benjamin Sandvik
*Assistant Examiner* — Farid Khan
(74) *Attorney, Agent, or Firm* — Slater Matsil, LLP

(57) ABSTRACT

A method for producing a thin-film semiconductor body is provided. A growth substrate is provided. A semiconductor layer with funnel-shaped and/or inverted pyramid-shaped recesses is epitaxially grown onto the growth substrate. The recesses are filled with a semiconductor material in such a way that pyramid-shaped outcoupling structures arise. A semiconductor layer sequence with an active layer is applied on the outcoupled structures. The active layer is suitable for generating electromagnetic radiation. A carrier is applied onto the semiconductor layer sequence. At least the semiconductor layer with the funnel-shaped and/or inverted pyramid-shaped recesses is detached, such that the pyramid-
(Continued)

shaped outcoupling structures are configured as projections on a radiation exit face of the thin-film semiconductor.

8 Claims, 6 Drawing Sheets

(51) Int. Cl.
 H01L 33/00 (2010.01)
 H01L 33/22 (2010.01)
(52) U.S. Cl.
 CPC .. *H01L 21/02458* (2013.01); *H01L 21/02494* (2013.01); *H01L 21/02502* (2013.01); *H01L 21/02664* (2013.01); *H01L 33/007* (2013.01); *H01L 33/0075* (2013.01); *H01L 33/22* (2013.01); *H01L 2933/0091* (2013.01)
(58) Field of Classification Search
 CPC ......... H01L 21/02458; H01L 21/02502; H01L 21/02494; H01L 21/0254
 See application file for complete search history.

(56) References Cited

U.S. PATENT DOCUMENTS

| | | | |
|---|---|---|---|
| 7,875,874 B2 | 1/2011 | Yoon et al. | |
| 7,952,109 B2 | 5/2011 | Ng | |
| 8,148,252 B1 | 4/2012 | Figuet et al. | |
| 8,154,034 B1 | 4/2012 | Zhang et al. | |
| 2004/0041156 A1 | 3/2004 | Tsuda et al. | |
| 2004/0113167 A1* | 6/2004 | Bader | H01L 33/46 257/98 |
| 2005/0285132 A1* | 12/2005 | Orita | B82Y 20/00 257/99 |
| 2005/0287687 A1* | 12/2005 | Liao | H01L 33/0079 438/22 |
| 2006/0091409 A1 | 5/2006 | Epler et al. | |
| 2008/0006831 A1* | 1/2008 | Ng | H01L 33/20 257/79 |
| 2008/0093612 A1 | 4/2008 | Konno et al. | |
| 2008/0121917 A1* | 5/2008 | Weisbuch | H01L 33/58 257/98 |
| 2009/0053845 A1 | 2/2009 | Wong et al. | |
| 2009/0078954 A1 | 3/2009 | Shim et al. | |
| 2009/0206354 A1 | 8/2009 | Kitano et al. | |
| 2010/0059781 A1* | 3/2010 | Yokobayashi | H01L 33/16 257/98 |
| 2010/0117109 A1* | 5/2010 | Unno | H01L 33/22 257/98 |
| 2010/0187495 A1* | 7/2010 | Yoon | H01L 21/0237 257/13 |
| 2010/0267186 A1 | 10/2010 | Wang et al. | |
| 2011/0062467 A1* | 3/2011 | Song | H01L 33/42 257/95 |
| 2011/0147777 A1* | 6/2011 | Konno | H01L 51/5275 257/98 |
| 2011/0220938 A1 | 9/2011 | Jeong | |
| 2012/0097991 A1* | 4/2012 | Ikeda | H01L 51/00 257/88 |
| 2012/0112188 A1* | 5/2012 | Yokoyama | H01L 21/0242 257/51 |
| 2012/0248459 A1* | 10/2012 | Sakano | H01L 21/0237 257/76 |
| 2012/0319126 A1 | 12/2012 | Butendeich et al. | |

FOREIGN PATENT DOCUMENTS

| | | | |
|---|---|---|---|
| CN | 101765924 A | 6/2010 | |
| DE | 19640594 A1 | 4/1998 | |
| DE | 10245628 A1 | 4/2004 | |
| DE | 102005013580 A1 | 10/2005 | |
| DE | 102005056604 A1 | 3/2007 | |
| WO | 0141225 A2 | 6/2001 | |
| WO | WO 2009120011 A2 * | 10/2009 | ............. H01L 33/42 |
| WO | 2011074534 A1 | 6/2011 | |

OTHER PUBLICATIONS

Rouviere, J.L., et al., "Transmission electron microscopy characterization of GaN layers grown by MOCVD on sapphire," Materials and Science Engineering, B43, 1997, pp. 161-166.

Schnitzer, I., et al., "30 external quantum efficiency from surface textured, thin-film light-emitting diodes," Applied Physics Letters, vol. 63, No. 16, Oct. 18, 1993, pp. 2174-2176.

* cited by examiner

THIN-FILM SEMICONDUCTOR BODY WITH ELECTRONMAGNETIC RADIATION OUTCOUPLING STRUCTURES

This patent application is a divisional of U.S. patent application Ser. No. 14/002,487, filed on Nov. 8, 2013 and titled "Method for Producing a Thin-Film Semiconductor Body and Thin-Film Semiconductor Body," which is a national phase filing under section 371 of PCT/EP2012/053348, filed Feb. 28, 2012, which claims the priority of German patent application 10 2011 012 928.6, filed Mar. 3, 2011, each of which is incorporated herein by reference in its entirety.

TECHNICAL FIELD

A method for producing a thin-film semiconductor body and a thin-film semiconductor body are provided.

BACKGROUND

Radiation-emitting semiconductor bodies are provided, for example, in German Patent Publication Nos. DE 10 2005 056 604 A1 and DE 10 2005 013 580 A1. However, these semiconductor bodies are not thin-film semiconductor bodies.

SUMMARY OF THE INVENTION

Embodiments of the present invention provide a method for producing a thin-film semiconductor body with well-defined outcoupling structures on the radiation exit face thereof. Furthermore, embodiments provide a corresponding thin-film semiconductor body.

A method for producing a thin-film semiconductor body comprises a number of steps. A growth substrate is provided. A semiconductor layer is epitaxially grown onto the growth substrate. The semiconductor layer includes funnel-shaped and/or inverted pyramid-shaped recesses. The recesses are filled with a semiconductor material in such a way that pyramid-shaped outcoupling structures arise. A semiconductor layer sequence with an active layer is applied on the outcoupling structures. The active layer is suitable for generating electromagnetic radiation. A carrier is applied onto the semiconductor layer sequence. At least one of the semiconductor layers with the funnel-shaped and/or inverted pyramid-shaped recesses is detached, such that the pyramid-shaped outcoupling structures are configured as projections on a radiation exit face of the thin-film semiconductor body.

In this method the inverted pyramid or funnel-shaped recesses produced by an epitaxial growth process serve as a matrix for forming the outcoupling structures. The inverted pyramid or funnel-shaped recesses produced by the epitaxial growth process are in particular V-defects or V-pits.

Particularly preferably, the recesses and accordingly the subsequent projections assume the shape of a right pyramid or of a right truncated pyramid with a preferably regularly configured hexagon as base.

The outcoupling structures are here advantageously produced using an epitaxial method, whereby the shape of the outcoupling structures is predetermined in a controlled manner during the production process. In this way, well-reproducible, well-defined outcoupling structures may in particular be produced.

The term "on(to)" does not here necessarily mean that two elements are arranged in direct contact with one another. Rather, it is possible for further elements to be arranged between two elements, for example, layers.

The term thin-film semiconductor body is here used to designate a semiconductor body comprising a generally epitaxially grown semiconductor layer sequence with an active radiation-generating layer, a growth substrate having been removed or thinned in such a way that alone it no longer provides sufficient mechanical stabilization for the thin-film semiconductor body. The semiconductor layer sequence of the thin-film semiconductor body is therefore preferably arranged on a carrier, which stabilizes the semiconductor body mechanically and particularly preferably is different from the growth substrate for the semiconductor layer sequence of the semiconductor body.

Furthermore a reflective layer is preferably arranged between the carrier and the radiation-generating semiconductor layer sequence. The object of the reflective layer is to direct the radiation of the active layer towards the radiation exit face of the thin-film semiconductor body. The semiconductor layer sequence furthermore preferably has a thickness of twenty micrometers or less. In particular, the thickness is in the range of five micrometers.

The basic principle of a thin-film light-emitting diode chip is described for example in the document I. Schnitzer et al., Appl. Phys. Lett. 63, 16, 18 Oct. 1993, pages 2174-2176, the disclosure content of which is hereby included in this respect by reference.

The growth substrate may, for example, contain one of the following materials or be formed of one of the following materials: sapphire, silicon, silicon carbide, gallium nitride.

According to one embodiment of the method, the growth substrate is removed in a separate method step prior to detachment of the semiconductor layer with the funnel-shaped and/or inverted pyramid-shaped recesses.

According to a further embodiment of the method, the temperature during epitaxial growth of the layer with the funnel-shaped and/or inverted pyramid-shaped recesses has a value of less than or equal to 850° C.

Filling of the recesses and/or application of the semiconductor layer sequence likewise preferably proceeds by means of an epitaxial growth process. Particularly preferably, both steps, i.e., filling of the recesses and application of the semiconductor layer sequence, proceed by means of an epitaxial growth process. This embodiment of the method offers the advantage that production of the thin-film semiconductor body proceeds predominantly or completely by means of an epitaxy process. This advantageously simplifies production of the thin-film semiconductor body.

Particularly preferably, filling of the recesses provides a surface that is as flat as possible.

Particularly preferably, the outcoupling structures are configured at least for the most part in such a way that the bases of adjacent projections are in mutual contact. According to one embodiment, the bases of at least 10% of adjacent projections, preferably of 80% of adjacent projections, particularly preferably of 90% of adjacent projections are in mutual contact.

According to one embodiment of the method, the outcoupling structures exhibit a base with a diameter of between 100 nm and 10 μm inclusive, preferably between 0.5 μm and 1.5 μm.

The height of the outcoupling structures is preferably of a value of between 100 nm and 10 μm inclusive, particularly preferably of between 0.5 μm and 1.5 μm.

According to a further embodiment of the method, a further material is applied onto the outcoupling structures for refractive index adaptation between the semiconductor material of the thin-film semiconductor body and the surrounding medium, generally air. The material for refractive index adaptation preferably has a refractive index of between 1 and 2.3 inclusive. The material for refractive index adaptation may, for example, be silicone or highly refractive glass.

The outcoupling structures may for example be formed from a nitride compound semiconductor material. Nitride compound semiconductor materials are compound semiconductor materials which contain nitrogen, such as for instance materials from the system $In_xAl_yGa_{1-x-y}N$ with $0 \leq x \leq 1$, $0 \leq y \leq 1$ and $x+y \leq 1$.

According to a further embodiment of the method, a stop layer is applied onto the recesses, which stop layer is provided at least to slow down the etching process in the event of detachment of the semiconductor layer with the recesses by means of an etching process. The stop layer is preferably suitable for slowing down the etching rate to $\frac{1}{5}$ of the original value, particularly preferably to $\frac{1}{20}$ of the original value. Particularly preferably, the stop layer is applied in direct contact onto the recesses. The stop layer may for example be deposited by means of an epitaxial process. A dry etching process may for example be used as the etching process. In such a process, the semiconductor layer with the recesses preferably comprises gallium nitride or consists of gallium nitride, while the stop layer, for example, contains aluminum gallium nitride or consists of aluminum gallium nitride.

After removal of the semiconductor layer with the recesses by an etching process, the stop layer may be removed by a further separate method step. A stop layer based on aluminum gallium nitride may for example be removed by means of a generally non-selective sputtering method.

In this embodiment, the growth substrate is preferably removed with a separate method step prior to the dry etching process. If the growth substrate comprises sapphire, for example, it is preferably removed prior to the dry etching process by means of a laser lift-off process. If the growth substrate comprises silicon, for example, it may be removed prior to the dry etching process by means of etching.

According to a further embodiment of the method, a sacrificial layer is applied between the growth substrate and the recesses, which sacrificial layer is suitable for removal using a laser lift-off process. The sacrificial layer is preferably applied in direct contact onto the recesses. The sacrificial layer may, for example, also be deposited by means of an epitaxial process. With the assistance of the sacrificial layer, the semiconductor layer with the recesses may be removed by a laser lift-off process. A sacrificial layer which may be removed with a laser lift-off process for example comprises indium gallium nitride or consists of indium gallium nitride.

In another embodiment, a thin-film semiconductor body is suitable for emitting electromagnetic radiation from a radiation exit face. A semiconductor layer sequence has an active layer, which is suitable for generating electromagnetic radiation. Epitaxially formed pyramid-shaped outcoupling structures are arranged on the radiation exit face.

The outcoupling structures are provided to increase the outcoupling of electromagnetic radiation, generated in the active layer, from the thin-film semiconductor body.

It should be noted at this point that the features described above in conjunction with the method may likewise be provided in the case of the thin-film semiconductor body itself. Furthermore, features disclosed in conjunction with the thin-film semiconductor body may also be used in combination with the method.

BRIEF DESCRIPTION OF THE DRAWINGS

Further advantageous embodiments and further developments of the invention are revealed by the exemplary embodiments described below in connection with the figures.

Figure 1A:
FIGS. 1A to 1H show schematic sectional representations of a thin-film semiconductor body during different stages of the method, according to one exemplary embodiment.

Identical, similar or identically acting elements are provided with the same reference numerals in the figures. The figures and the size ratios of the elements illustrated in the figures relative to one another are not to be regarded as being to scale. Rather, individual elements, in particular layer thicknesses, may be illustrated on an exaggeratedly large scale for greater ease of depiction and/or better comprehension.

DETAILED DESCRIPTION OF ILLUSTRATIVE EMBODIMENTS

In the method according to the exemplary embodiment of FIGS. 1A to 1I, in a first step a growth substrate 1 is provided (FIG. 1A). The growth substrate 1 may, for example, contain sapphire, silicon, gallium nitride or silicon carbide or be formed of one of these materials.

Figure 1B:
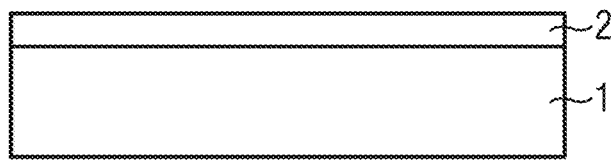

In a next step a seed layer 2 is applied epitaxially onto the growth substrate 1 (FIG. 1B). The seed layer 2 is here formed of gallium nitride.

Figure 1C:
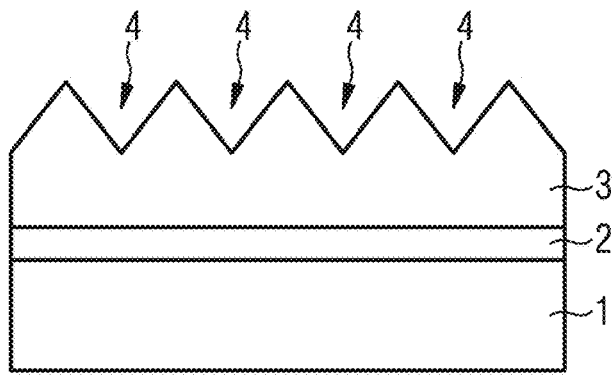

In a next step a buffer layer 3, which is here likewise formed of gallium nitride, is applied epitaxially onto the seed layer 2. On epitaxial application of the buffer layer 3, the growth conditions are adjusted such that recesses 4 form, which have the shape of inverted right pyramids with a regular hexagon as base (FIG. 1C). To this end, the temperature during epitaxial deposition here amounts to 850 C.

Figure 1D:
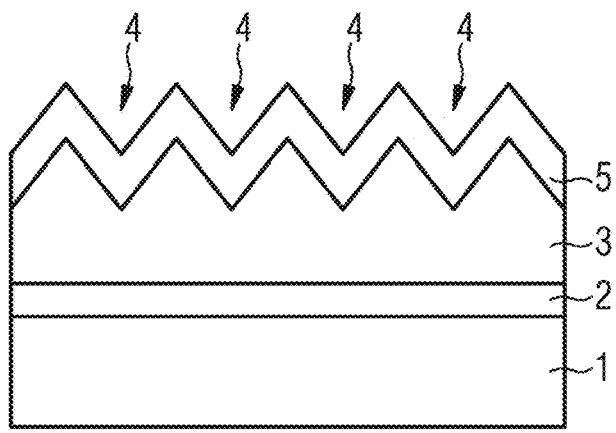

In a next method step, a continuous stop layer 5 is applied in direct contact onto the recesses 4 (FIG. 1D). In the process, the shape of the recesses 4 is transferred to the stop layer 5, i.e., the stop layer 5 also comprises inverted pyramid-shaped recesses 4.

Figure 1E:
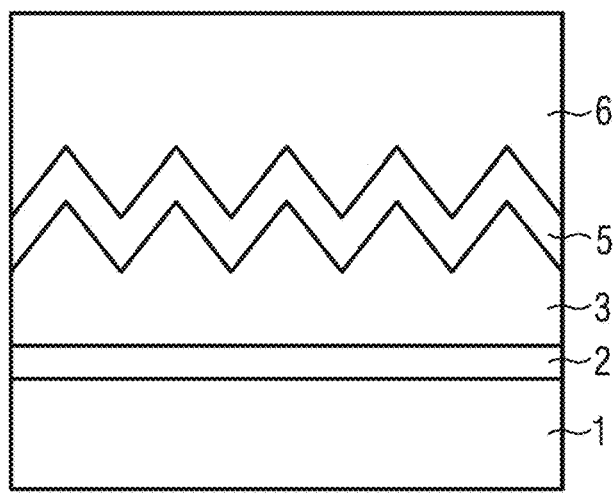

Using an epitaxial method, the recesses 4 are then filled in with a semiconductor material 6, here an n-doped gallium nitride material, and planarized, resulting in a flat surface (FIG. 1E).

Figure 1F:
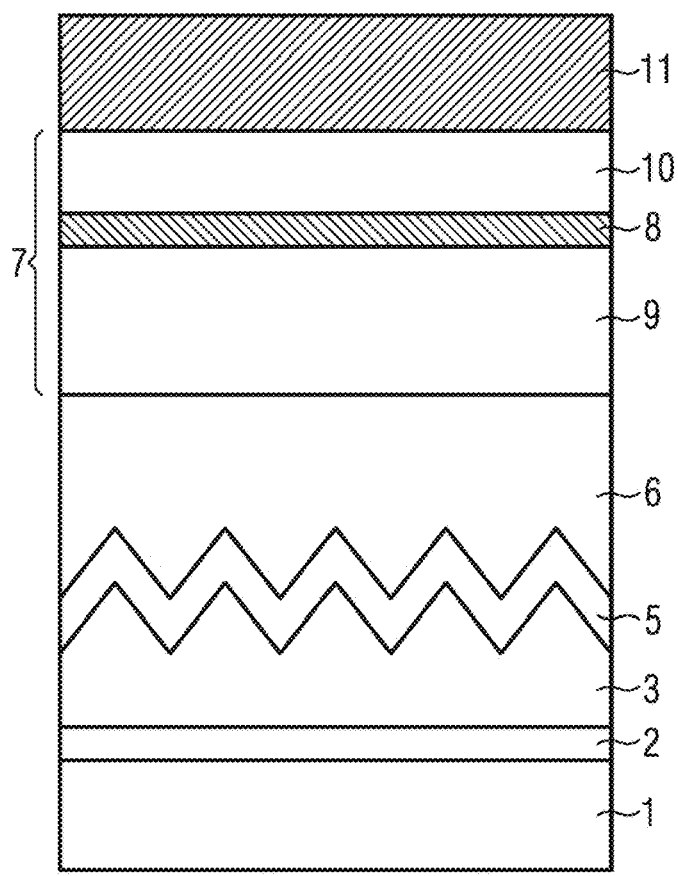

A semiconductor layer sequence 7 with an active layer 8 is grown onto the flat surface, the active layer 8 being suitable for generating electromagnetic radiation (FIG. 1F).

The semiconductor layer sequence 7 here takes the form of an LED structure. The semiconductor layer sequence 7 comprises an n-doped semiconductor layer 9. The n-doped semiconductor layer 9 is applied in direct contact onto the flat surface of the filled recesses 4 and comprises individual gallium nitride layers. The active layer 8 is arranged on the n-doped semiconductor layer 9. The active layer is suitable for generating electromagnetic radiation. The active layer 8 comprises alternating individual gallium nitride layers and individual indium gallium nitride layers. A p-doped semiconductor layer 10 is additionally arranged on the active layer 8. The p-doped semiconductor layer 10 comprises individual gallium nitride layers and individual aluminum gallium nitride layers.

Furthermore, a carrier 11 is arranged on the semiconductor layer sequence 7, which carrier is applied, for example, by means of adhesive bonding, soldering or direct bonding onto the semiconductor layer sequence 7.

Figure 1G:
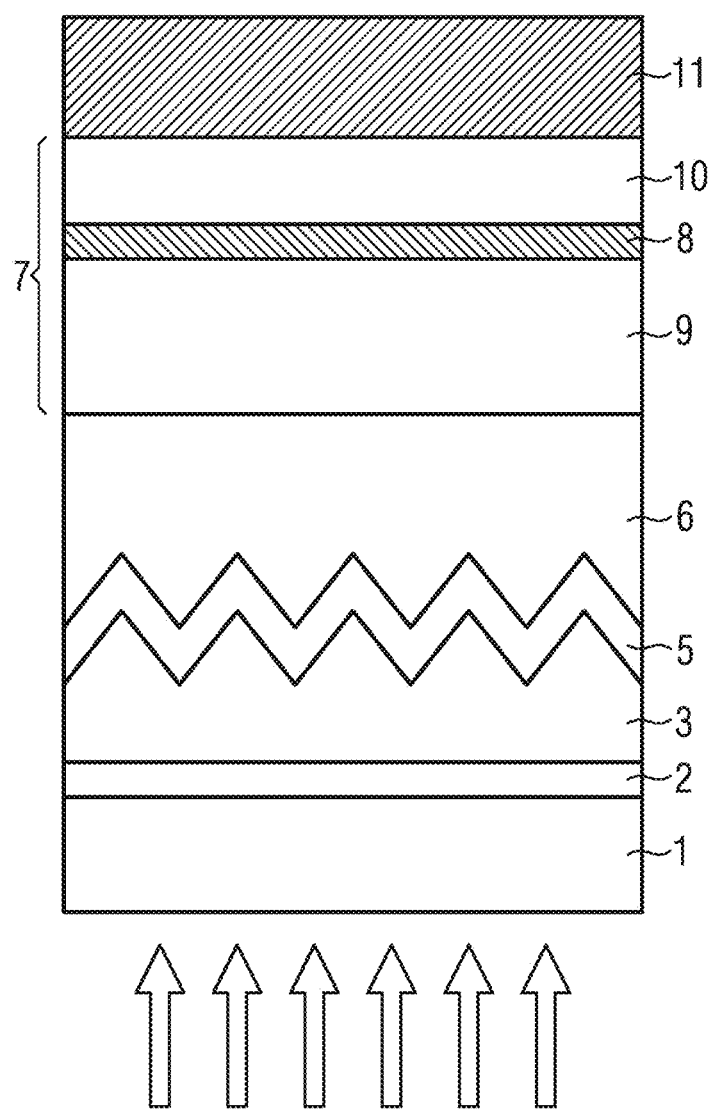

As shown schematically in FIG. 1G, the growth substrate 1 is then removed using a laser lift-off process.

Figure 1H:
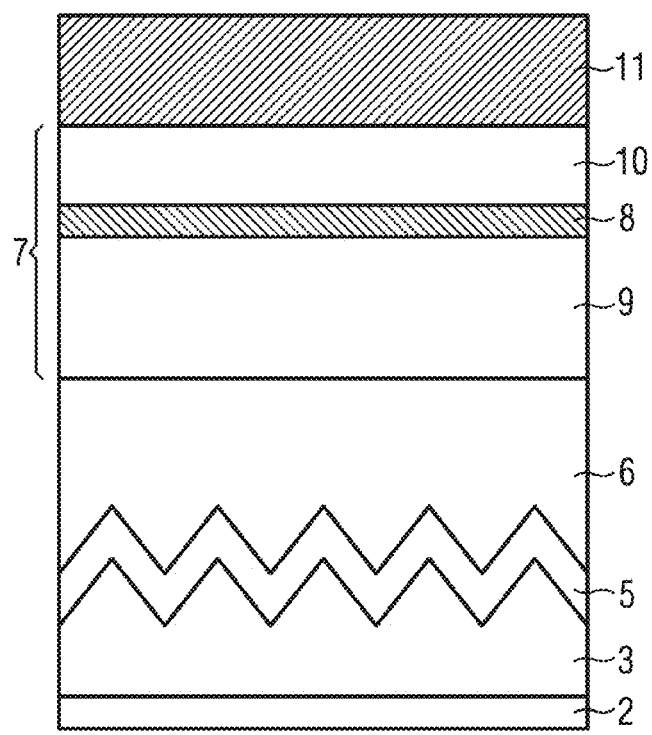
Figure 1I:
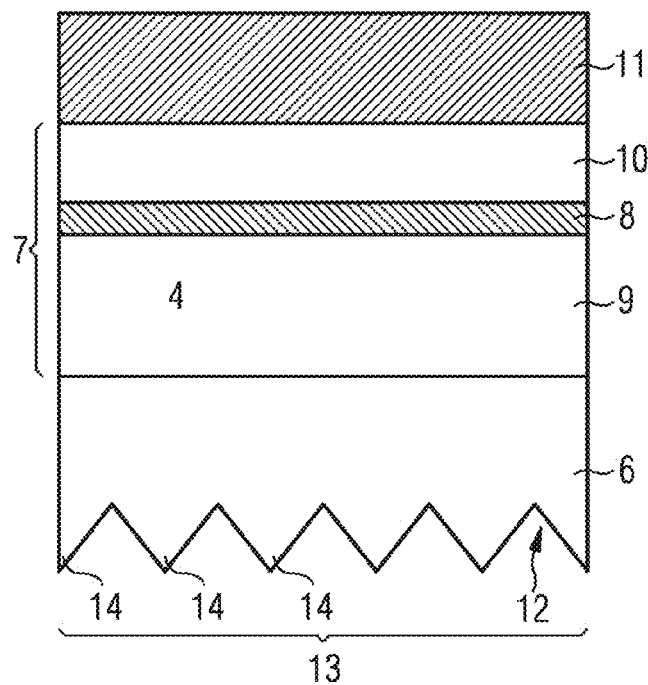
FIG. 1I shows a schematic sectional representation of a thin-film semiconductor body according to one exemplary embodiment.

In a next step, the remaining gallium nitride material 3 is detached down to the stop layer 5, for example, by a chemically assisted dry etching process (FIG. 1H). The stop layer 5 is suitable for at least slowing down the etching process. The stop layer 5 in this case preferably comprises aluminum gallium nitride or consists of said material. In a next step the stop layer 5 may, for example, be removed by means of a selective sputtering step (FIG. 1I).

If the growth substrate 1 is formed of another material than sapphire, for example of silicon, no laser lift-off process is needed to remove the growth substrate 1. A silicon substrate may, for example, be removed by etching.

As shown schematically in FIG. 11, the finished thin-film semiconductor body comprises a semiconductor layer sequence 7 with an active layer 8, which is suitable for generating electromagnetic radiation. The epitaxially grown semiconductor layer sequence 7 is stabilized mechanically by a carrier 11, which is different from the growth substrate 1. A radiation exit face 12 of the thin-film semiconductor body comprises epitaxially grown outcoupling structures 13, which are formed by projections 14, the projections 14 having the shape of a right pyramid with a hexagonal base. The pyramid-shaped projections 14 are in the present exemplary embodiment made of a gallium nitride material.

Figure 2A:
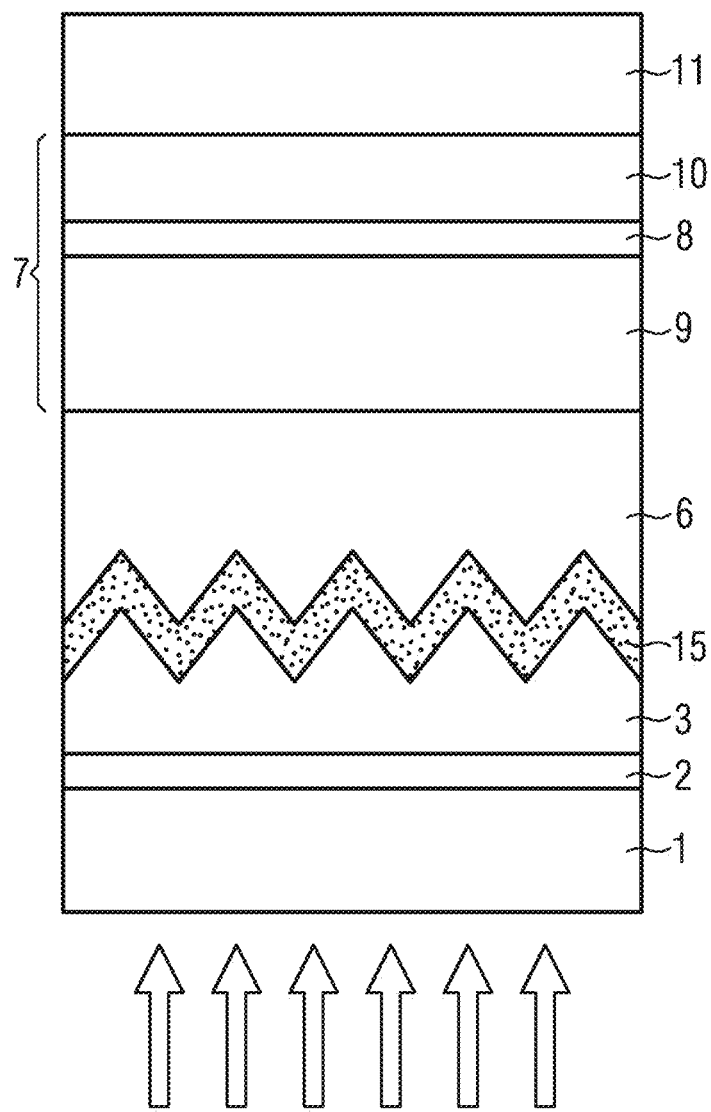
FIGS. 2A and 2B show schematic sectional representations of a thin-film semiconductor body at different stages of the method, according to a further exemplary embodiment.
Figure 2B:
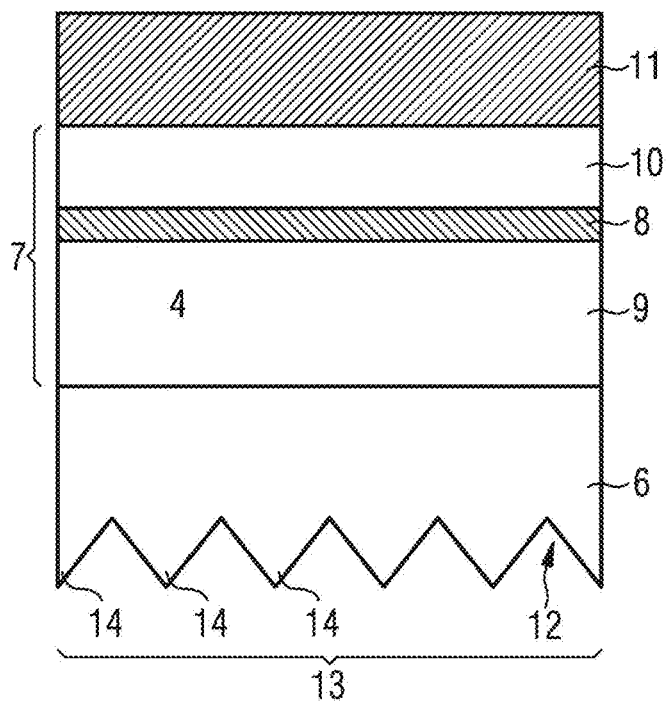

Unlike in the exemplary embodiment according to FIGS. 1A to 1E, in the method according to the exemplary embodiment of FIGS. 2A and 2B a selective laser lift-off process is used to expose the radiation exit face 12 of the thin-film semiconductor body.

The method stage according to the exemplary embodiment of FIG. 2A corresponds substantially to the method stage according to FIG. 1F.

In contrast with the method stage of FIG. 1F, a continuous sacrificial layer 15 is applied in direct contact onto the recesses 4, said sacrificial layer being suitable for selectively absorbing light from a laser. The recesses 4 form likewise in the sacrificial layer 15. The sacrificial layer 15 for example comprises indium gallium nitride or consists of indium gallium nitride. Through selective removal of the sacrificial layer 15 by a laser lift-off process, the outcoupling structures 13 are exposed and the semiconductor layer sequence 7 with the active radiation-generating layer 8 is separated (FIG. 2A). This results in a finished thin-film semiconductor body, such as is shown for example in FIG. 2B and already described in detail with reference to FIG. 1I.

It is additionally possible for a further material to be applied onto the radiation exit face 12 of the thin-film semiconductor body for refractive index adaptation. This material may, for example, be a highly refractive glass or silicone.

Figure 3:
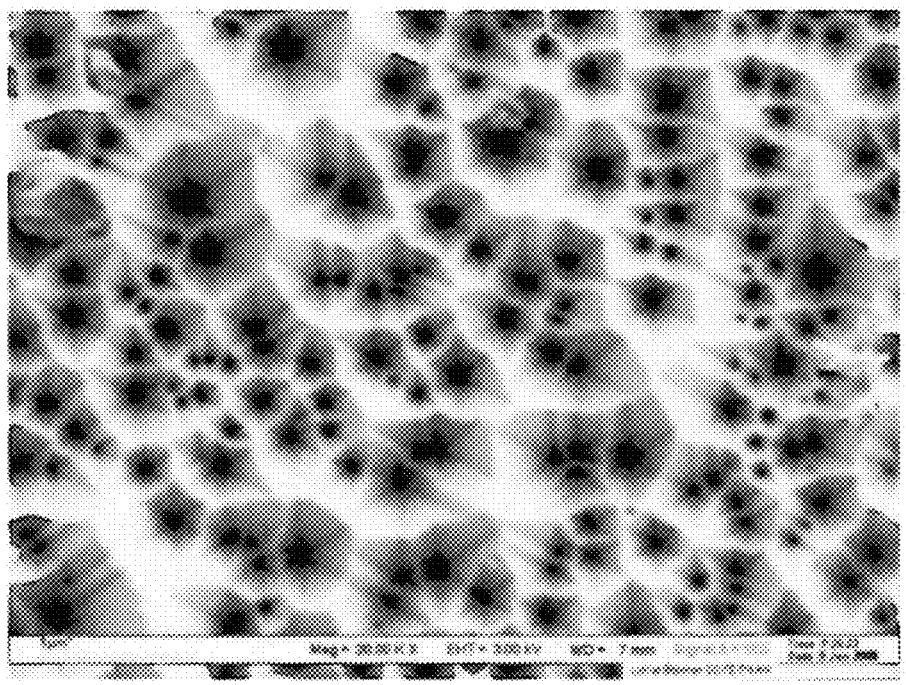
FIG. 3 shows by way of example a scanning electron micrograph of a semiconductor layer with funnel-shaped and/or inverted pyramid-shaped recesses.

As the exemplary scanning electron micrograph of a semiconductor layer with epitaxially grown funnel-shaped and/or pyramid-shaped recesses 4 of FIG. 3 shows, the recesses 4 are formed such that the edges of directly adjacent recesses 4 are in mutual contact. The recesses 4 comprise openings with a diameter of between 100 nm and 10 µm inclusive. The depth of the recesses 4 is likewise between 100 nm and 10 µm inclusive.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

What is claimed is:

1. A thin-film semiconductor body configured to emit electromagnetic radiation from a radiation exit face, comprising:
    a semiconductor layer sequence with an active zone configured to generate the electromagnetic radiation;
    a carrier different from a growth substrate from which the semiconductor layer sequence is grown;
    a reflective layer arranged between the carrier and the semiconductor layer sequence;
    epitaxially formed pyramid-shaped outcoupling structures arranged at the radiation exit face; and
    a refractive layer overlying the outcoupling structures, wherein the refractive layer adapts a refractive index between semiconductor material of the thin-film semiconductor body and a surrounding medium, wherein the refractive layer is formed from one of a refractive glass or from a silicone.

2. The thin-film semiconductor body according to claim 1, wherein the semiconductor layer sequence has a thickness of 20 micrometers or less.

3. The thin-film semiconductor body according to claim 1, wherein faces of adjacent ones of the outcoupling structures are in mutual contact.

4. The thin-film semiconductor body according to claim 1, wherein each of the outcoupling structures comprises a projection with a base having a diameter of between 100 nm and 10 µm, inclusive.

5. The thin-film semiconductor body according to claim 1, wherein each of the outcoupling structures comprises a projection with a base with a diameter of between 0.5 nm and 1.5 µm, inclusive.

6. The thin-film semiconductor body according to claim 1, wherein the refractive index of the refractive layer is between 1 and 2.3, inclusive.

7. The thin-film semiconductor body according to claim 1, in which the outcoupling structures are formed from a nitride compound semiconductor material.

8. The thin-film semiconductor body according to claim 1, wherein each of the outcoupling structures has a form of one of a right pyramid or a right truncated pyramid, and further has a base that is a regularly configured hexagon.

* * * * *